(12) United States Patent
Zhu

(10) Patent No.: US 9,098,251 B2
(45) Date of Patent: Aug. 4, 2015

(54) SERVER MECHANISM AND DISK DRIVE MODULE THEREOF

(71) Applicant: Wistron Corporation, New Taipei (TW)

(72) Inventor: Chong-Xing Zhu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 163 days.

(21) Appl. No.: 14/058,284

(22) Filed: Oct. 21, 2013

(65) Prior Publication Data

US 2015/0049429 A1 Feb. 19, 2015

(30) Foreign Application Priority Data

Aug. 16, 2013 (CN) ...................... 2013 2 0503416 U

(51) Int. Cl.
*H05K 7/20* (2006.01)
*G06F 1/18* (2006.01)
*G11B 33/00* (2006.01)
*H05K 7/14* (2006.01)

(52) U.S. Cl.
CPC *G06F 1/18* (2013.01); *G11B 33/00* (2013.01); *H05K 7/1487* (2013.01)

(58) Field of Classification Search
USPC ......................................................... 361/727
See application file for complete search history.

(56) References Cited

U.S. PATENT DOCUMENTS

| 7,012,803 B1* | 3/2006 | Austin et al. | 361/679.33 |
|---|---|---|---|
| 8,693,182 B2* | 4/2014 | Kuo et al. | 361/679.33 |
| 2009/0161309 A1* | 6/2009 | Yang | 361/679.39 |
| 2011/0051356 A1* | 3/2011 | Yang et al. | 361/679.39 |

* cited by examiner

*Primary Examiner* — Anthony Q Edwards
(74) *Attorney, Agent, or Firm* — Winston Hsu; Scott Margo

(57) ABSTRACT

A server mechanism includes a server and a disk drive module including a fixing frame fixed to an extraction opening of the server, a rail sheet, a disk drive movably disposed through the fixing frame, a sliding sheet disposed at the disk drive and having a sliding slot, a sliding block, and a first elastic member. The rail sheet is disposed at the fixing frame and has an installation rail, an incurved rail, a longitudinal rail, and a detaching rail. The incurved rail has a recess. The sliding block is slidably disposed in the sliding slot and has a guide rod for moving along the installation rail, the incurved rail, or the detaching rail with movement of the disk drive. The first elastic member is for driving the guide rod to be fixed in the recess and for driving the guide rod from the longitudinal rail to the detaching rail.

16 Claims, 16 Drawing Sheets

SERVER MECHANISM AND DISK DRIVE MODULE THEREOF

BACKGROUND OF THE INVENTION

1. Field of the Invention

The present invention relates to a server mechanism and a disk drive mechanism thereof, and more specifically, to a server mechanism capable of fixing a disk drive in an extraction opening of a server or extracting the disk drive from the extraction opening by guidance of a guide rod along rails.

2. Description of the Prior Art

In general, there is usually a disk drive (e.g. an optical disk drive) disposed on a server for a user to perform data access and update operations of the server. The conventional configuration is to assemble the disk drive in an extraction opening of the server. However, since there is no auxiliary mechanism for helping a user quickly assemble the disk drive on the server or disassemble the disk drive from the server, the user needs to open an upper cover of the server in advance, and then perform the disk drive assembly and disassembly operations within the server. Accordingly, it may result in time-consuming and strenuous assembly and disassembly processes, so as to cause the user much inconvenience.

SUMMARY OF THE INVENTION

The present invention provides a server mechanism including a server and a disk drive mechanism. The server has an extraction opening. The disk drive module includes a fixing frame, a rail sheet, a disk drive, a sliding sheet, a sliding block, and at least one first elastic member. The fixing frame is fixed to a position of the server corresponding to the extraction opening. The rail sheet is disposed at an inner side wall of the fixing frame and has an installation rail, an incurved rail, a longitudinal rail, and a detaching rail communicated with each other. The incurved rail has a recess. The installation rail has a first opening. The disk drive is movably disposed through the fixing frame. The sliding sheet is disposed at a side of the disk drive corresponding to the rail sheet and has a sliding slot. The sliding block is slidably disposed in the sliding slot and has a guide rod protruding toward the rail sheet. The guide rod is used for passing through the first opening and moving along the installation rail, the incurved rail, or the detaching rail when the disk drive moves relative to the extraction opening. The at least one first elastic member is disposed between the sliding block and the sliding slot for providing elastic force to drive the guide rod to be fixed in the recess along the incurved rail and to drive the guide rod to move from the longitudinal rail to the detaching rail.

The present invention further provides a disk drive module detachably disposed in an extraction opening of a server. The disk drive module includes a fixing frame, a rail sheet, a disk drive, a sliding sheet, a sliding block, and at least one first elastic member. The fixing frame is fixed to a position of the server corresponding to the extraction opening. The rail sheet is disposed at an inner side wall of the fixing frame and has an installation rail, an incurved rail, a longitudinal rail, and a detaching rail communicated with each other. The incurved rail has a recess. The installation rail has a first opening. The disk drive is movably disposed through the fixing frame. The sliding sheet is disposed at a side of the disk drive corresponding to the rail sheet and has a sliding slot. The sliding block is slidably disposed in the sliding slot and has a guide rod protruding toward the rail sheet. The guide rod is used for passing through the first opening and moving along the installation rail, the incurved rail, or the detaching rail when the disk drive moves relative to the extraction opening. The at least one first elastic member is disposed between the sliding block and the sliding slot for providing elastic force to drive the guide rod to be fixed in the recess along the incurved rail and to drive the guide rod to move from the longitudinal rail to the detaching rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
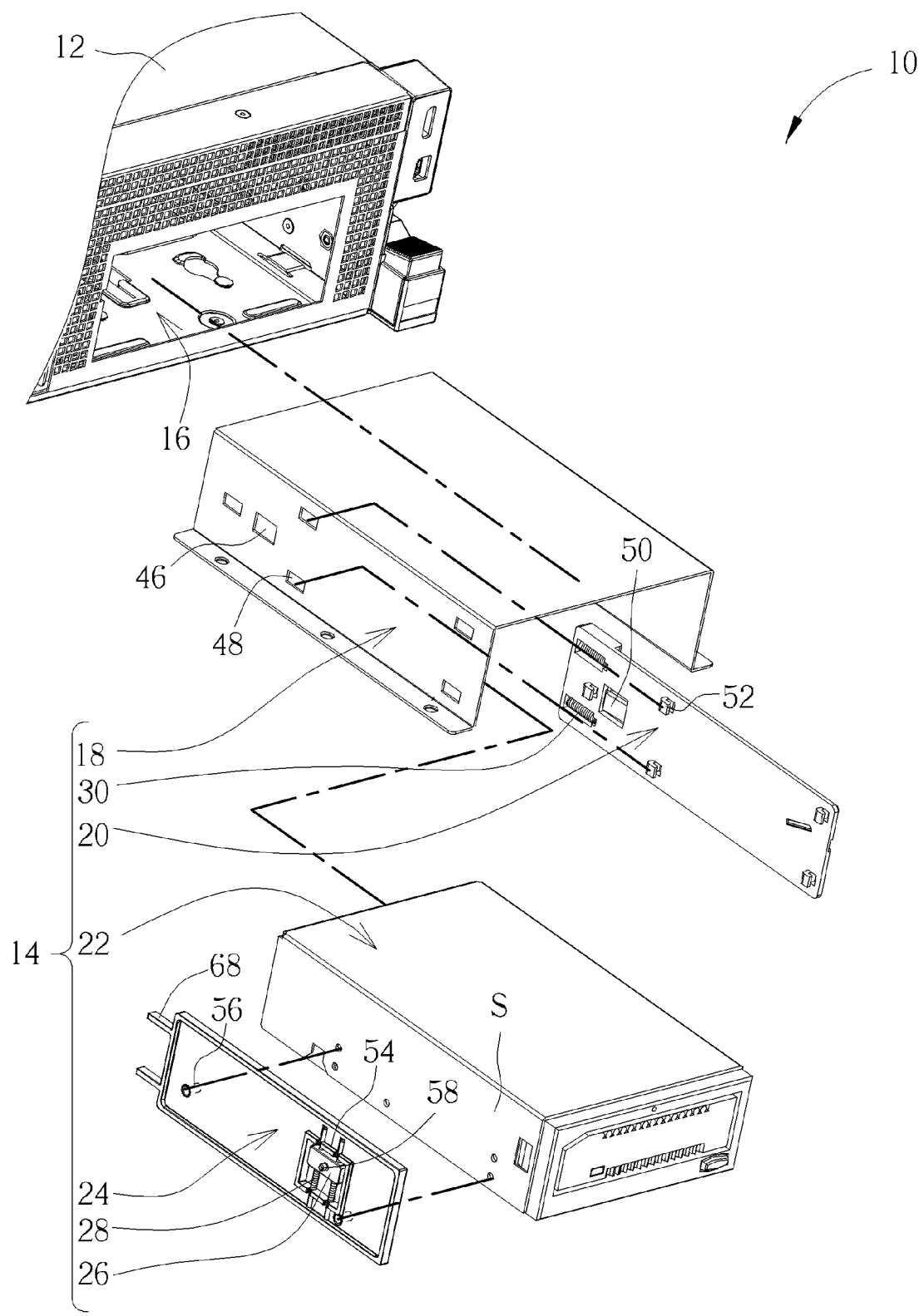
FIG. 1 is an exploded diagram of a server mechanism according to an embodiment of the present invention.

Please refer to FIG. 1, which is an exploded diagram of a server mechanism 10 according to an embodiment of the present invention. The server mechanism 10 includes a server 12 (partially depicted in FIG. 1) and a disk drive module 14. The server 12 has an extraction opening 16 for a user to perform the disk drive assembly and disassembly operations of the server mechanism 10. As shown in FIG. 1, the disk drive module 14 includes a fixing frame 18, s rail sheet 20, a disk drive 22, a sliding sheet 24, a sliding block 26, at least one first elastic member 28 (two shown in FIG. 1, but not limited thereto), and at least one second elastic member 30 (two shown in FIG. 1, but not limited thereto). The disk drive 22 is movably disposed through the fixing frame 18. The disk drive 22 could be a conventional disk drive apparatus for data access, such as an optical disk drive.

Figure 2:
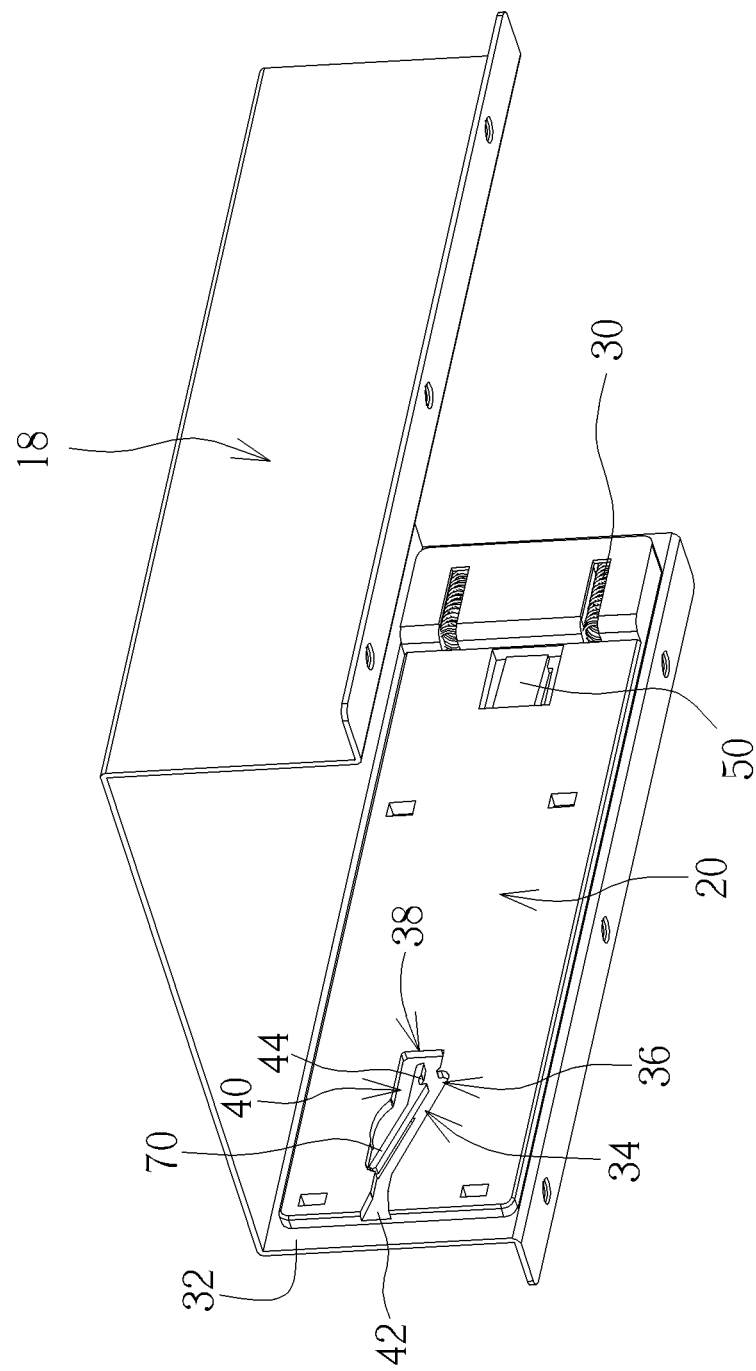
FIG. 2 is a diagram of a rail sheet in FIG. 1 being disposed on an inner side wall of a fixing frame.
Figure 3:
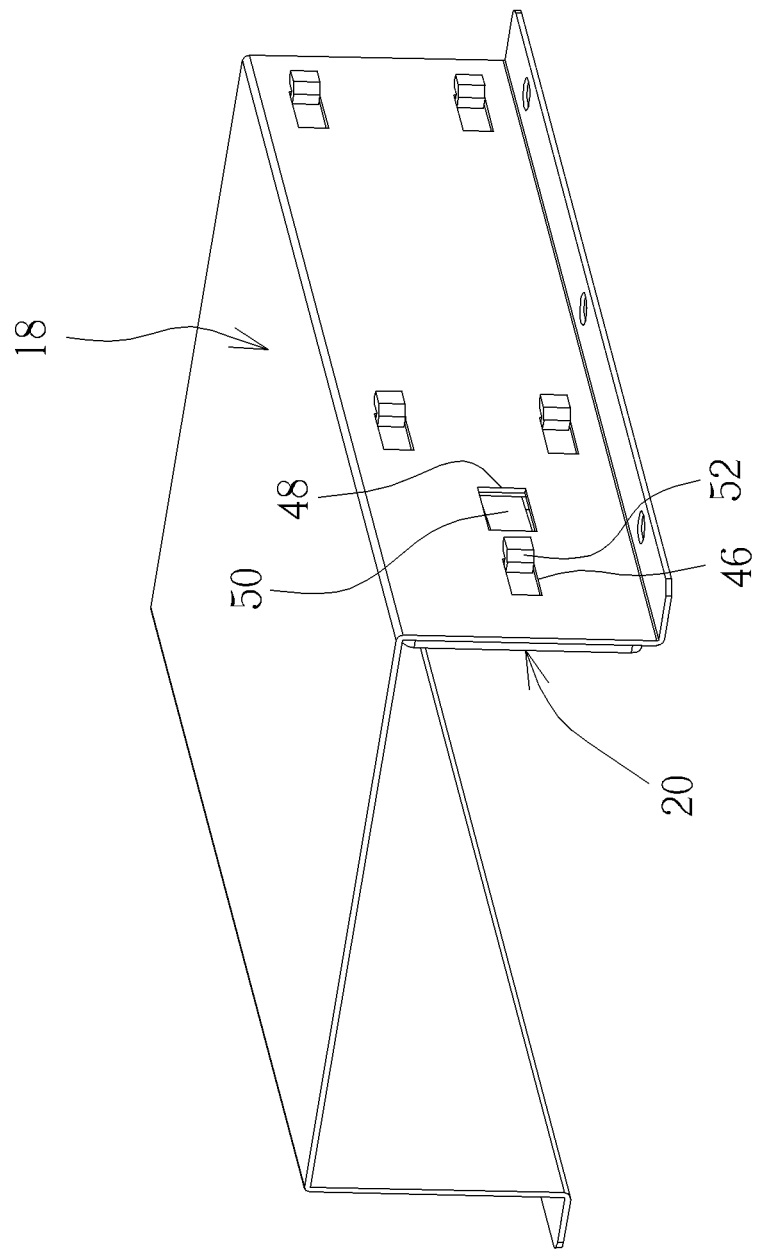
FIG. 3 is a diagram of the fixing frame in FIG. 2 having the rail sheet disposed thereon at another viewing angle.

Please refer to FIG. 1, FIG. 2, and FIG. 3. FIG. 2 is a diagram of the rail sheet 20 in FIG. 1 being disposed on an inner side wall 32 of the fixing frame 18. FIG. 3 is a diagram of the fixing frame 18 in FIG. 2 having the rail sheet 20 disposed thereon at another viewing angle. The fixing frame 18 could adopt a conventional fixing method to be disposed in the server 12 corresponding to the extraction opening 16. For example, the fixing frame 18 could be riveted to a bottom board of the server 12. The related description for the aforesaid fixing method is commonly seen in the prior art, and therefore omitted herein. The rail sheet 20 is disposed on the inner side wall 32 of the fixing frame 18 and has an installation rail 34, an incurved rail 36, a longitudinal rail 38, and a detaching rail 40. The installation rail 34 has a first opening 42. The incurved rail 36 has a recess 44. In this embodiment, the installation rail 34 could be an oblique rail and the detaching rail 40 could be a transverse rail. Furthermore, the fixing design for fixing the fixing frame 18 to the rail sheet 20 could be as shown in FIG. 3. That is, a positioning hole 46 and at least one hook hole 48 (five respectively shown in FIG. 1 and FIG. 3, but not limited thereto) could be formed on the inner side wall 32 of the fixing frame 18. The rail sheet 20 has an elastic sheet 50 corresponding to the positioning hole 46 and a hook 52 corresponding to the hook hole 48. When the hook 52 is engaged with the hook hole 48, the elastic sheet 50 could be engaged with the positioning hole 46 accordingly so as to fix the rail sheet 20 to the inner side wall 32 of the fixing frame 18.

Figure 4:
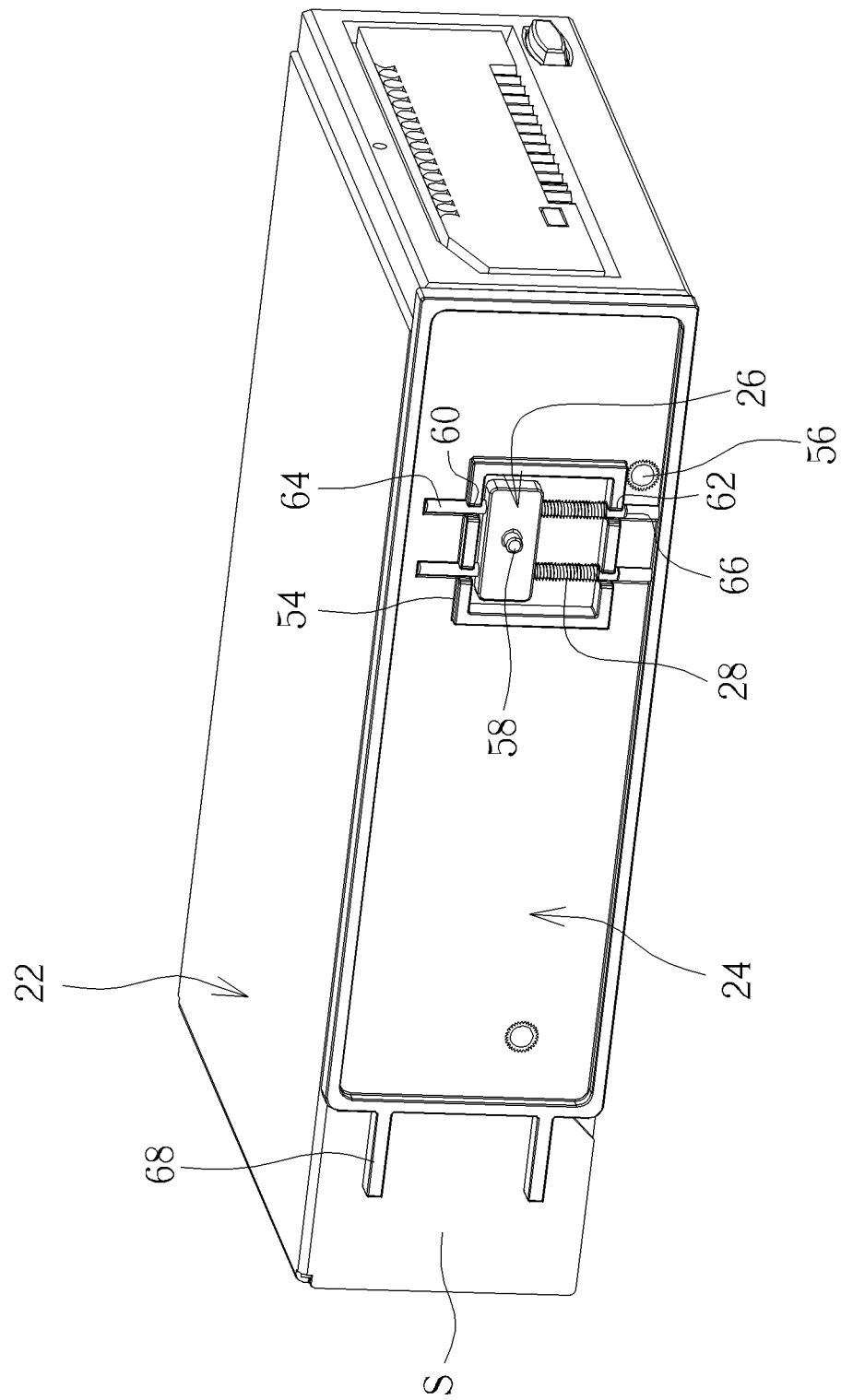
FIG. 4 is a diagram of a sliding sheet and a sliding block in FIG. 1 being disposed on a disk drive.

Please refer to FIG. 1 and FIG. 4. FIG. 4 is a diagram of the sliding sheet 24 and the sliding block 26 in FIG. 1 being disposed on the disk drive 22. The sliding sheet 24 is disposed at a side S of the rail sheet 20 and has a sliding slot 54. To be more specific, in this embodiment, the sliding sheet 24 could further has at least one fixing rod 56 (two shown in FIG. 1 and FIG. 4, but not limited thereto). The fixing rod 56 is inserted into the side S of the disk drive 22 corresponding to the rail sheet 20 for fixing the sliding sheet 24 to the disk drive 22. The sliding block 26 is slidably disposed in the sliding slot 54 and has a guide rod 58 protruding toward the rail sheet 20. The guide rod 58 could pass through the first opening 42 and move along the installation rail 34, the incurved rail 36, or the detaching rail 40 with inward or outward movement of the disk drive 22 in the extraction opening 16. Furthermore, in this embodiment, the sliding slot 54 could have at least one upper slot hole 60 and at least one lower slot hole 62 (two shown in FIG. 4 respectively, but not limited thereto). The sliding block 26 has an upper sliding rod 64 extending toward the upper slot hole 60 and a lower sliding rod 66 extending toward the lower slot hole 62. The upper sliding rod 64 is movably disposed through the upper slot hole 60, and the lower sliding rod 66 is movably disposed through the lower slot hole 62. In such a manner, the sliding block 26 could slide in the sliding slot 54 more smoothly and steadily.

Please refer to FIG. 1, FIG. 2, and FIG. 4. In this embodiment, the first elastic member 28 could be a spring and be disposed between the sliding block 26 and the sliding slot 54. That is, as shown in FIG. 4, the lower sliding rod 66 could be disposed through the first elastic member 28 so that the first elastic member 28 could be in a compressed state after being pressed by the sliding block 26. In such a manner, the first elastic member 28 could provide elastic force for driving the guide rod 58 to be fixed in the recess 44 and driving the guide rod 58 to move from the longitudinal rail 38 to the detaching rail 40. Furthermore, for achieving the purpose that the guide rod 58 could be fixed in the recess 44 more steadily and the disk drive 22 could be ejected from the extraction opening 16 automatically, as shown in FIG. 1, FIG. 2, and FIG. 4, the second elastic member 30 could be disposed on the rail sheet 20. The sliding sheet 24 has a positioning rod 68 protruding toward the second elastic member 30 for abutting against the second elastic member 30. Accordingly, the second elastic member 30 could provide lateral elastic force to the positioning rod 68 when the second elastic member 30 is pressed by the positioning rod 68, so as to make the guide rod 58 fixed in the recess 44 steadily by the lateral elastic force of the second elastic member 30. Furthermore, the lateral elastic force provided by the second elastic member 30 could also drive the guide rod 58 to move along the detaching rail 40 and then cause the disk drive 22 to be ejected from the extraction opening 16, so that a user could extract the disk drive 22 from the extraction opening 16 conveniently.

To be noted, in this embodiment, for preventing the guide rod 58 from moving to the detaching rail 40 when the guide rod 58 moves along the installation rail 34, the rail sheet 20 could further has a block part 70. The block part 70 could be an elastic sheet and be disposed at a position where the installation rail 34 is communicated with the detaching rail 40, so as to stop the guide rod 58 from moving to the detaching rail 40 accidentally when the guide rod 58 passes through a position where the installation rail 34 is communicated with the detaching rail 40. In such a manner, the server mechanism 10 could surely prevent the problem that the disk drive 22 could not be fixed in the extraction opening 16.

Figure 5:
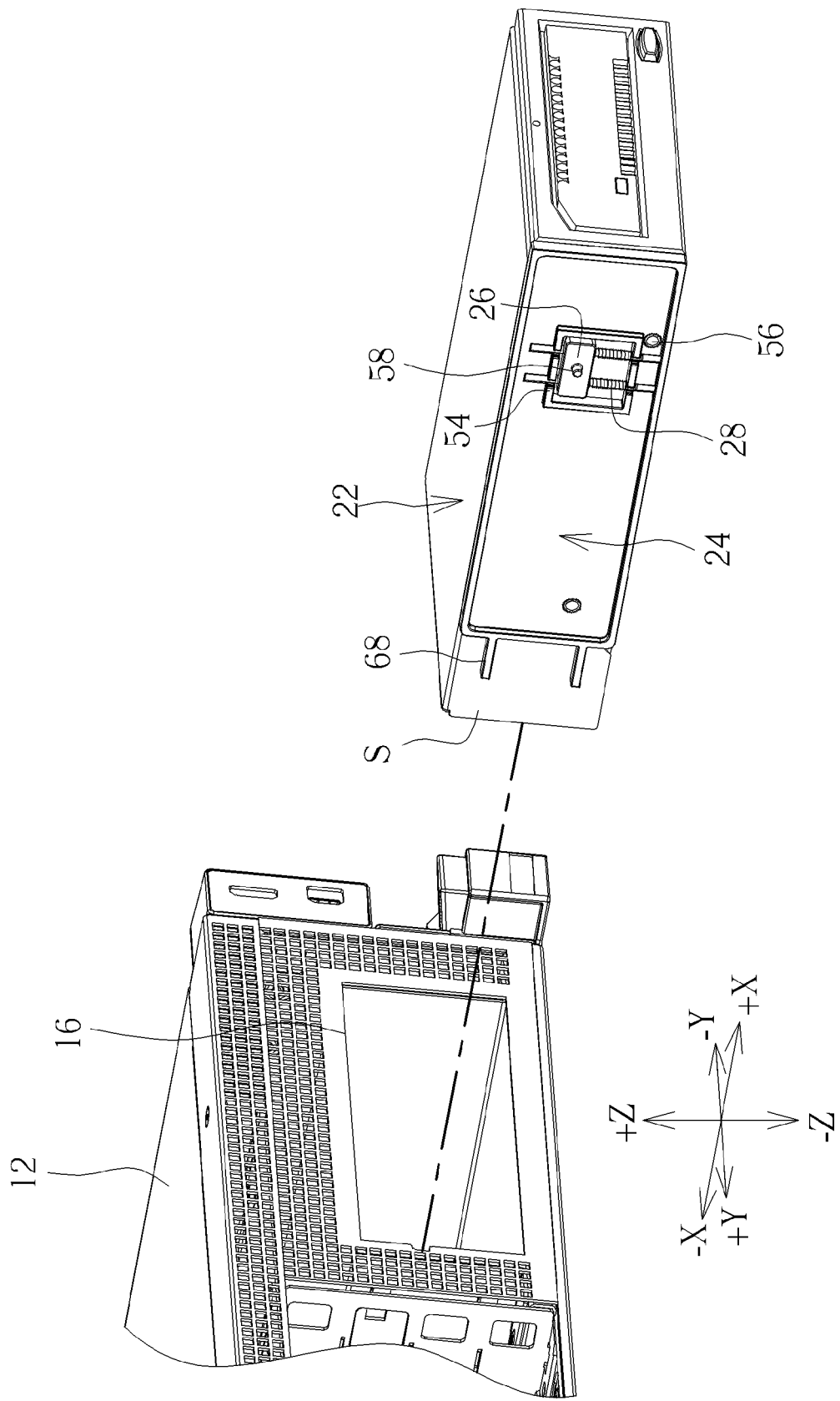
FIG. 5 is a diagram showing that the disk drive in FIG. 4 has not been inserted into an extraction opening of the server yet.
Figure 6:
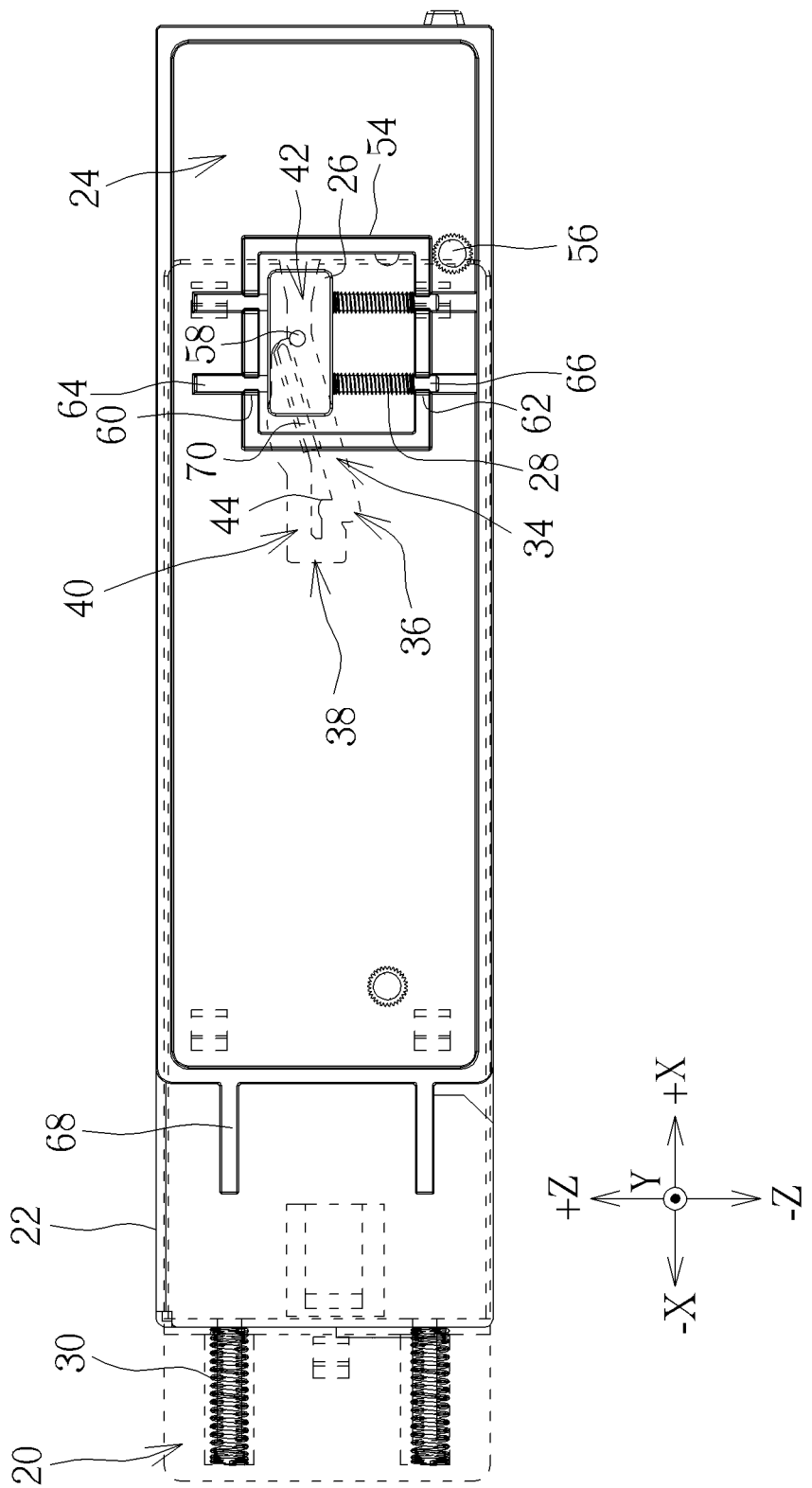
FIG. 6 is a side view of a guide rod on the sliding block in FIG. 5 passing through a first opening to enter an installation rail of the rail sheet with movement of the disk drive.
Figure 7:
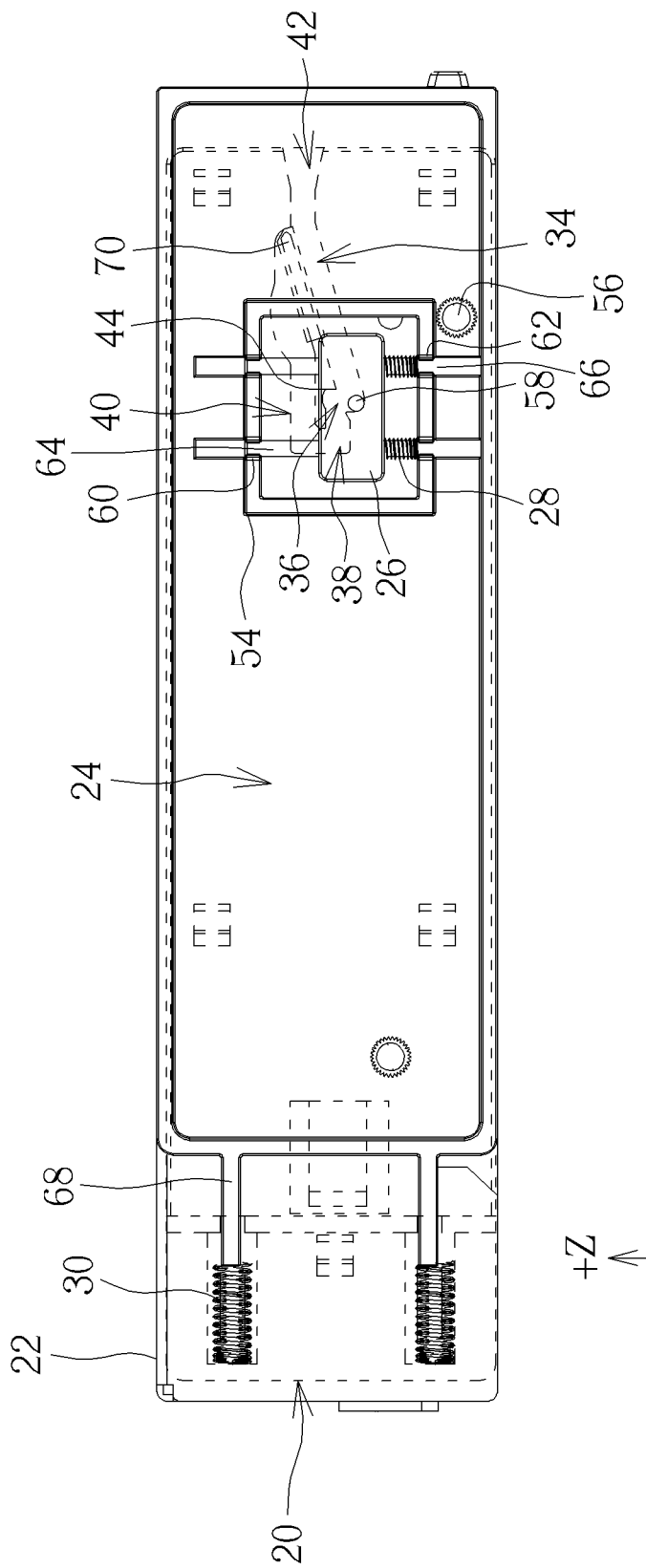
FIG. 7 is a side view of the guide rod in FIG. 6 moving to an incurved rail along the installation rail.
Figure 8:
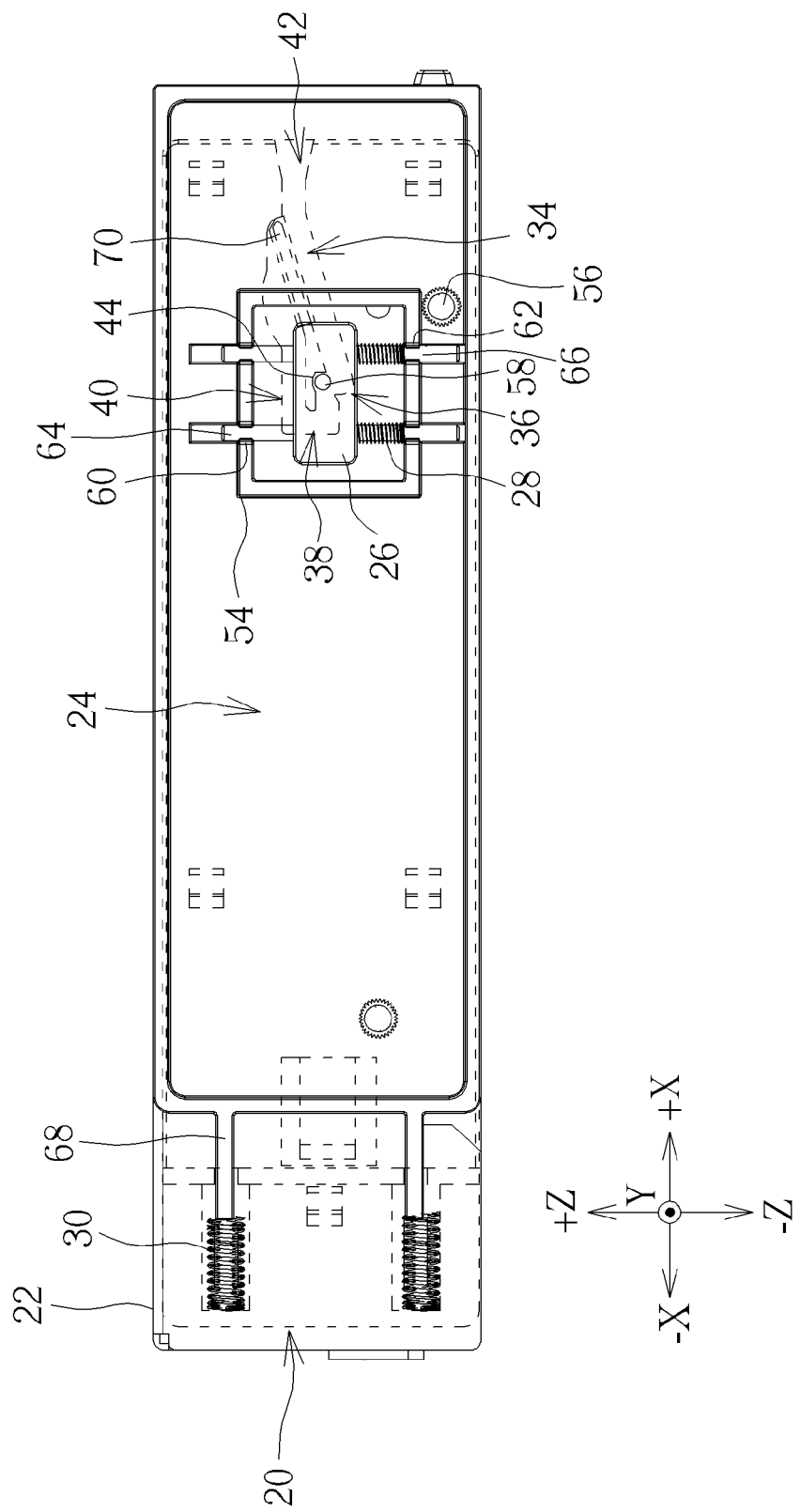
FIG. 8 is a side view of the guide rod moving along the incurved rail to a position where the guide rod is fixed in a recess.
Figure 9:
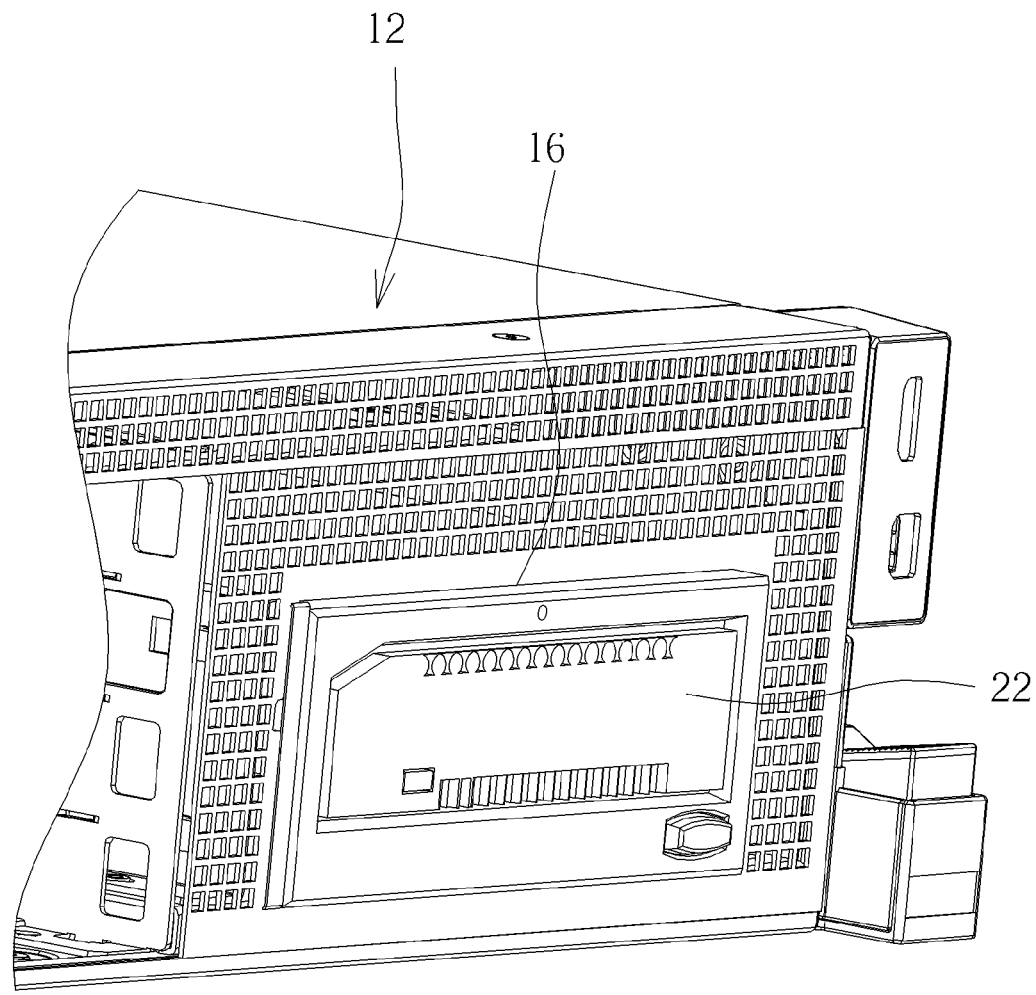
FIG. 9 is a diagram of the disk drive in FIG. 5 being assembled on the server.

More detailed description for the disk drive assembly and disassembly operations of the server mechanism 10 is provided as follows. Please refer to FIG. 5, FIG. 6, FIG. 7, FIG. 8, and FIG. 9. FIG. 5 is a diagram showing that the disk drive 22 in FIG. 4 has not been inserted into the extraction opening 16 of the server 12 yet. FIG. 6 is a side view of the guide rod 58 on the sliding block 26 in FIG. 5 passing through the first opening 42 to enter the installation rail 34 of the rail sheet 20 with movement of the disk drive 22. FIG. 7 is a side view of the guide rod 58 in FIG. 6 moving to the incurved rail 36 along the installation rail 34. FIG. 8 is a side view of the guide rod 58 moving to a position where the guide rod 58 is fixed in the recess 44 along the incurved rail 36. FIG. 9 is a diagram of the disk drive 22 in FIG. 5 being assembled on the server 12. For clearly showing movement of the guide rod 58 in the installation rail 34 and the incurved rail 36, the fixing frame 18 and the server 12 are omitted and the rail sheet 20 is depicted in a perspective view in FIG. 6, FIG. 7, and FIG. 8.

When a user wants to assemble the disk drive 22 in the extraction opening 16 of the server 12, the user just needs to insert the disk drive 22 into the extraction opening 16 of the server 12 in an −X-axis direction as shown in FIG. 5. During the aforesaid process, the guide rod 58 on the sliding block 26 could pass through the first opening 42 to enter the installation rail 34 of the rail sheet 20 (as shown in FIG. 6) and then move along the installation rail 34 until the incurved rail 36 stops the guide rod 58 from moving inward relative to the extraction opening 16 (as shown in FIG. 7). At this time, as shown in FIG. 7, the first elastic member 28 could be compressed by the sliding block 26 and the second elastic member 30 could be compressed by the positioning rod 68.

Subsequently, the user could stop exerting force on the disk drive 22. Accordingly, elastic force provided by the first elastic member 28 could drive the sliding block 26 to slide upward so as to make the guide rod 58 move upward to a position where the guide rod 58 is engaged with the recess 44 as shown in FIG. 8 along the incurved rail 36 for constraining movement of the guide rod 58 toward ±Z-axis directions and an +X-axis direction as shown in FIG. 8. At this time, movement of the guide rod 58 toward the −X-axis direction as shown in FIG. 8 could also be constrained by lateral elastic force provided by the second elastic member 30. In such a manner, the guide rod 58 could be fixed steadily in the recess 44 to make the disk drive 22 fixed in the extraction opening 16 (as shown in FIG. 9), so that the disk drive assembly operation of the server mechanism 10 could be completed.

Figure 10:
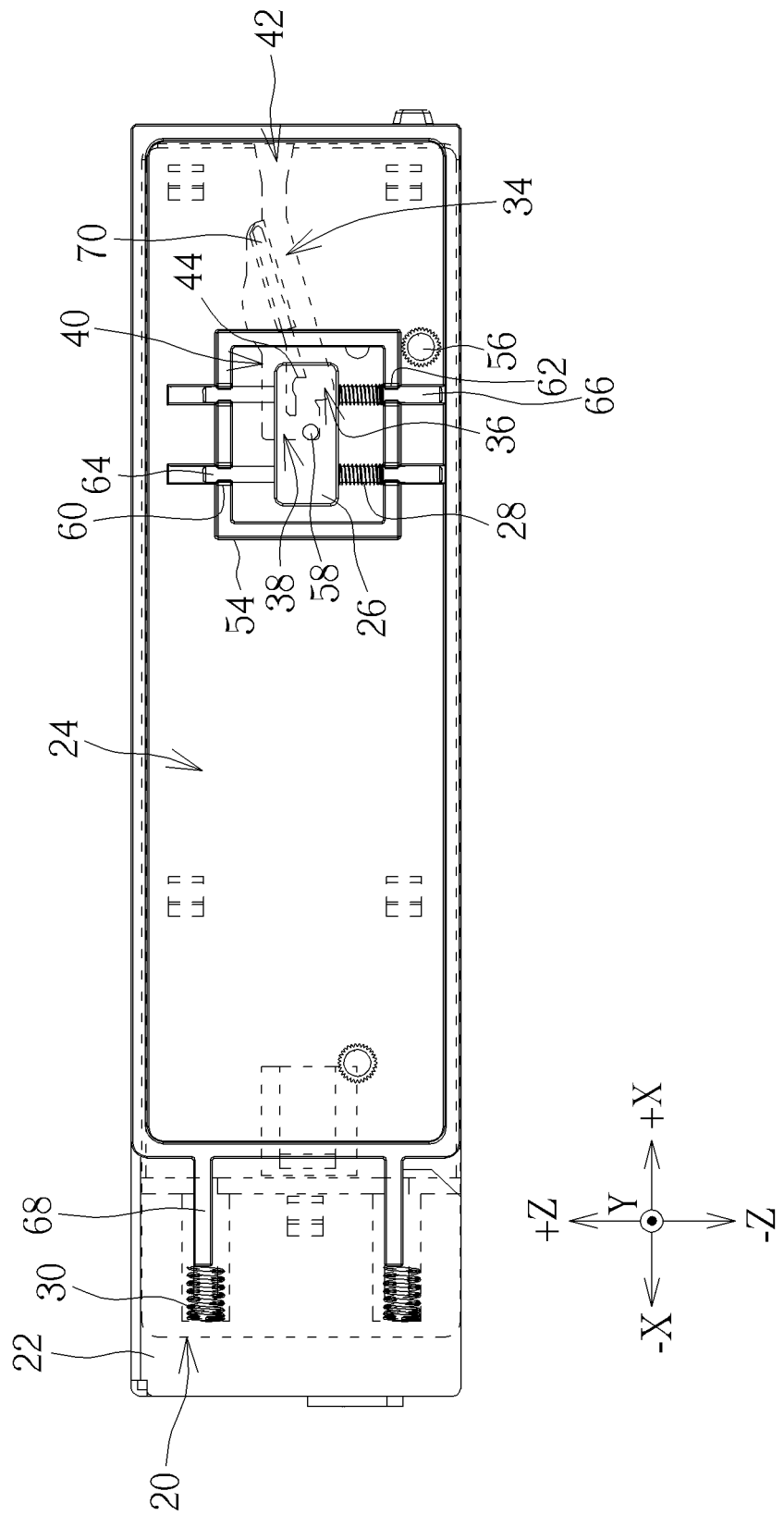
FIG. 10 is a side view of the guide rod in FIG. 8 moving from the incurved rail to a longitudinal rail.
Figure 11:
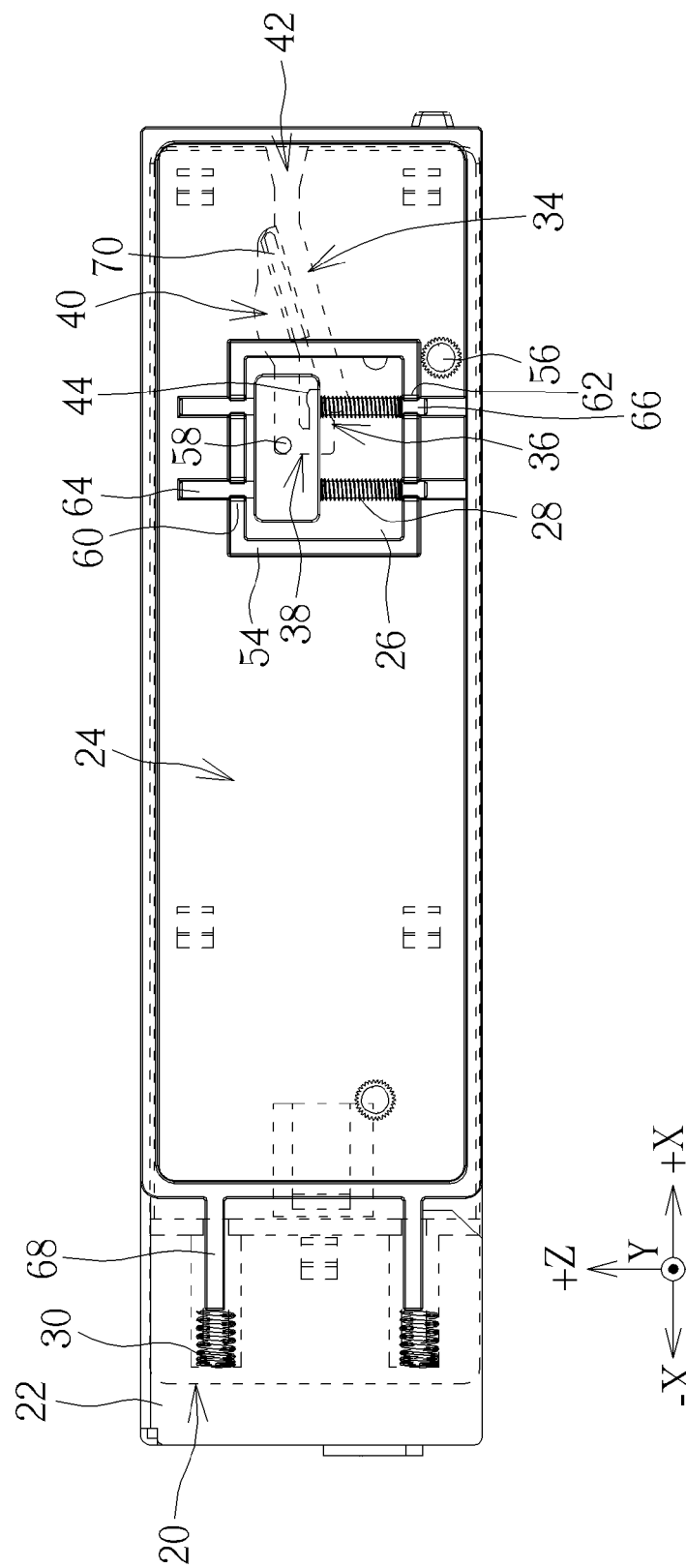
FIG. 11 is a side view of the guide rod in FIG. 10 moving from the longitudinal rail to a detaching rail.
Figure 12:
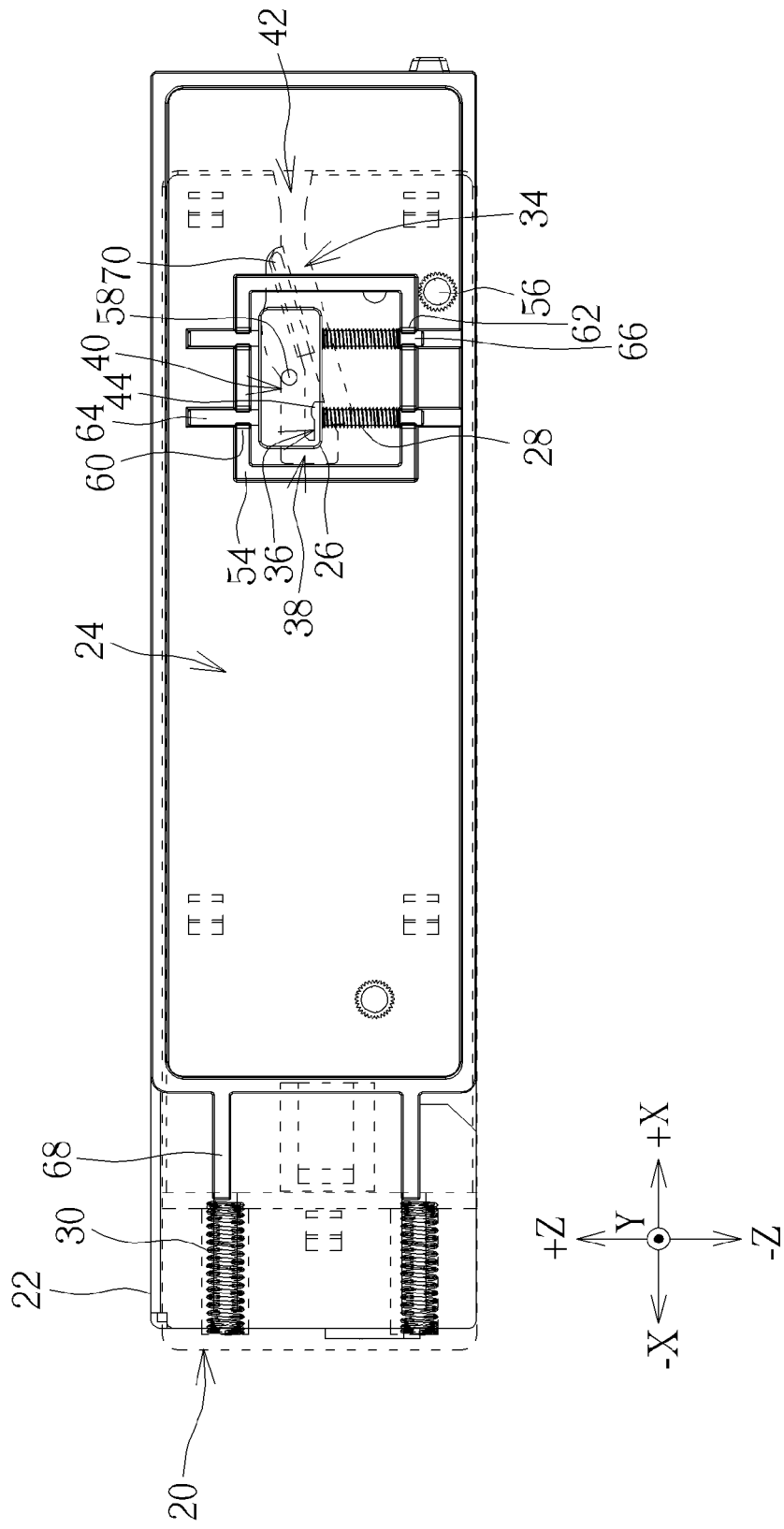
FIG. 12 is a side view of a second elastic member in FIG. 11 driving a positioning rod to make the guide rod move along the detaching rail.
Figure 13:
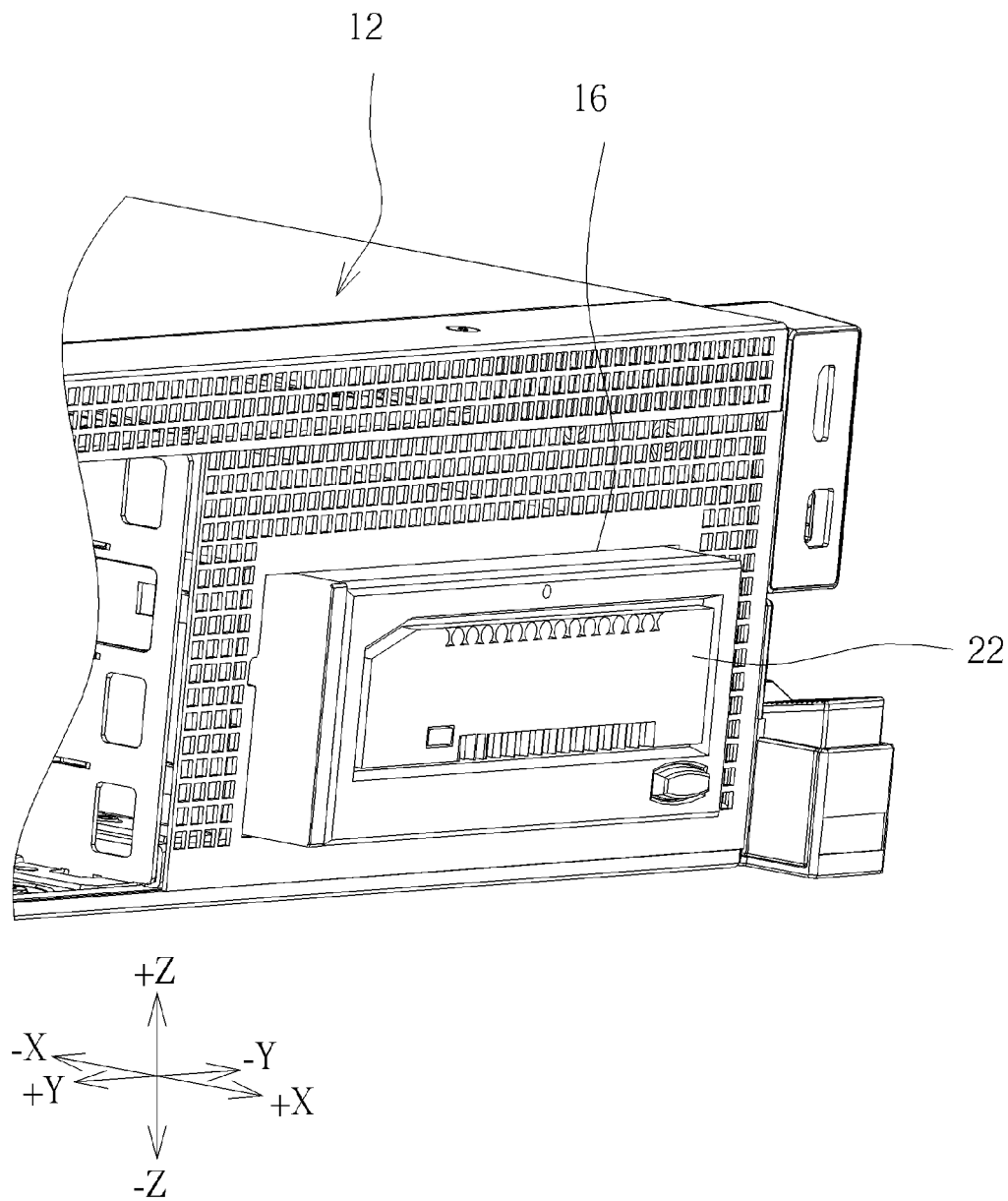
FIG. 13 is a diagram of the disk drive in FIG. 12 being ejected from the extraction opening of the server 12.
Figure 14:
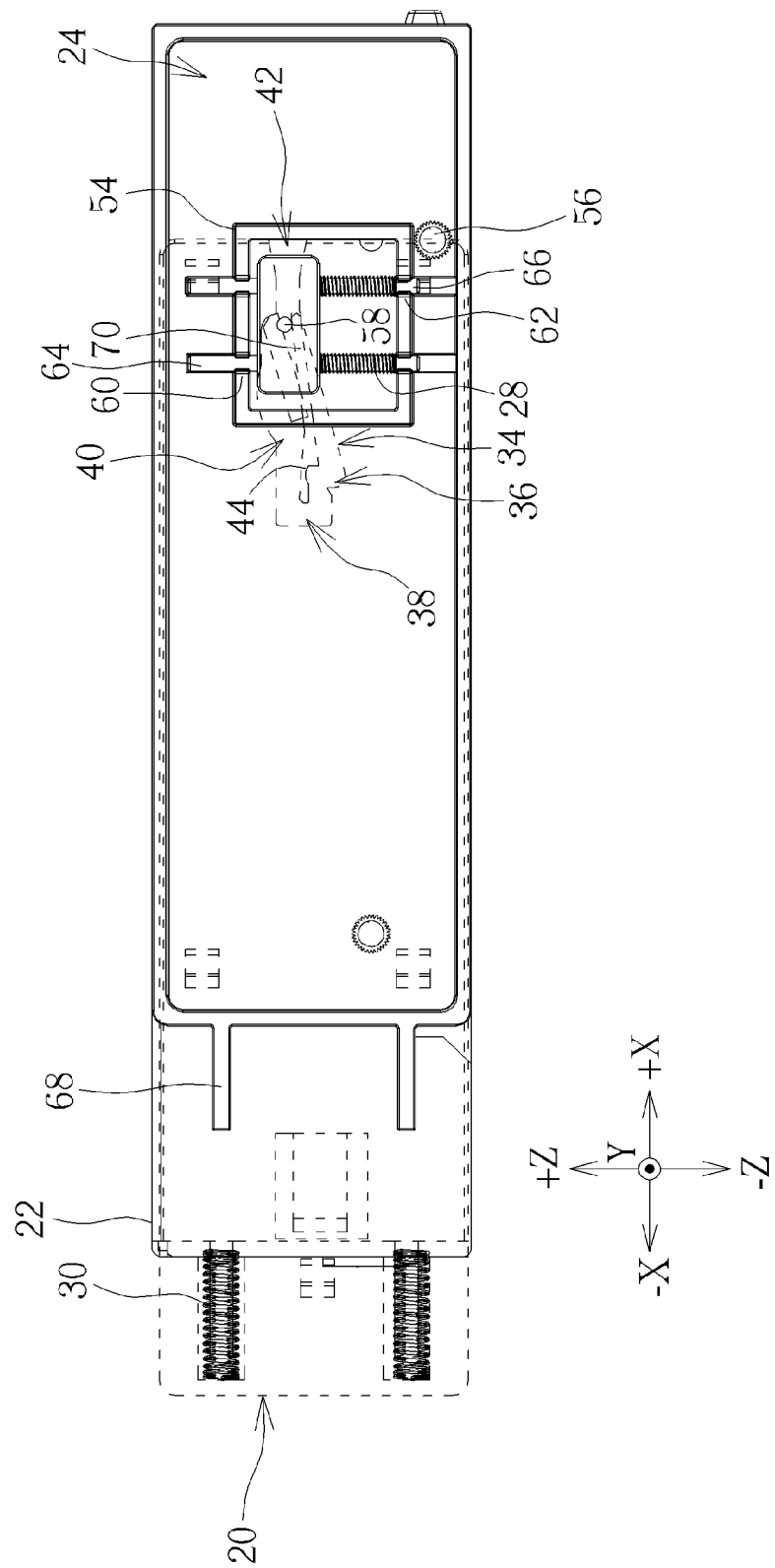
FIG. 14 is a side view of the guide rod in FIG. 11 moving along the detaching rail to press a block part.

Please refer to FIG. 8, FIG. 9, FIG. 10, FIG. 11, FIG. 12, FIG. 13, and FIG. 14. FIG. 10 is a side view of the guide rod 58 in FIG. 8 moving from the incurved rail 36 to the longitudinal rail 38. FIG. 11 is a side view of the guide rod 58 in FIG. 10 moving from the longitudinal rail 38 to the detaching rail 40. FIG. 12 is a side view of the second elastic member 30 in FIG. 11 driving the positioning rod 68 to make the guide rod 58 move along the detaching rail 40. FIG. 13 is a diagram of the disk drive 22 in FIG. 12 being ejected from the extraction opening 16 of the server 12. FIG. 14 is a side view of the guide rod 58 in FIG. 11 moving along the detaching rail 40 to press the block part 70. For clearly showing movement of the guide rod 58 in the longitudinal rail 38 and the detaching rail 40, the fixing frame 18 and the server 12 are omitted and the rail sheet 20 is depicted in a perspective view in FIG. 10, FIG. 11, FIG. 12, and FIG. 14.

When the user wants to extract the disk drive 22 in FIG. 9 from the extraction opening 16 of the server 12, the user just needs to push the disk drive 22 to overcome the lateral elastic force of the second elastic member 30 so as to make the disk drive 22 move inward relative to the extraction opening 16. During the aforesaid process, with inward movement of the disk drive 22 relative to the extraction opening 16, the guide rod 58 could be correspondingly disengaged from the recess 44 of the incurved rail 36 and then move along the −X-axis direction as shown in FIG. 10 until the longitudinal rail 38 stops the guide rod 58 from moving inward relative to the extraction opening 16 (as shown in FIG. 10). At this time, as shown in FIG. 10, the first elastic member 28 could be still compressed by the sliding block 26, and the second elastic member 30 could be still compressed by the positioning rod 68.

Subsequently, the user could stop exerting force on the disk drive 22. Accordingly, the elastic force provided by the first elastic member 28 could drive the sliding block 26 to slide upward so as to make the guide rod 58 move upward to a position as shown in FIG. 11 along the longitudinal rail 38. At this time, the positioning rod 68 could be driven to move in the +X-axis direction as shown in FIG. 11 by the lateral elastic force provided by the aforesaid second elastic member 30 until the second elastic member 30 return to its original length. In such a manner, the guide rod 58 could move along the detaching rail 40 to a position as shown in FIG. 12, so as to make the disk drive 22 ejected from the extraction opening 16 (as shown in FIG. 13). Finally, after the disk drive 22 is ejected from the extraction opening 16, the user could pull the disk drive 22 to move outward relative to the extraction opening 16. During the aforesaid process, the guide rod 58 could move along the detaching rail 40 to press the block part 70 (as shown in FIG. 14) with outward movement of the disk drive 22 and then pass through the first opening 42 of the installation rail 34 to be separated from the rail sheet 20. Accordingly, the user could extract the disk drive 22 from the extraction opening 16 of the server 12 so as to complete the disk drive disassembly operation of the server mechanism 10.

Figure 15:
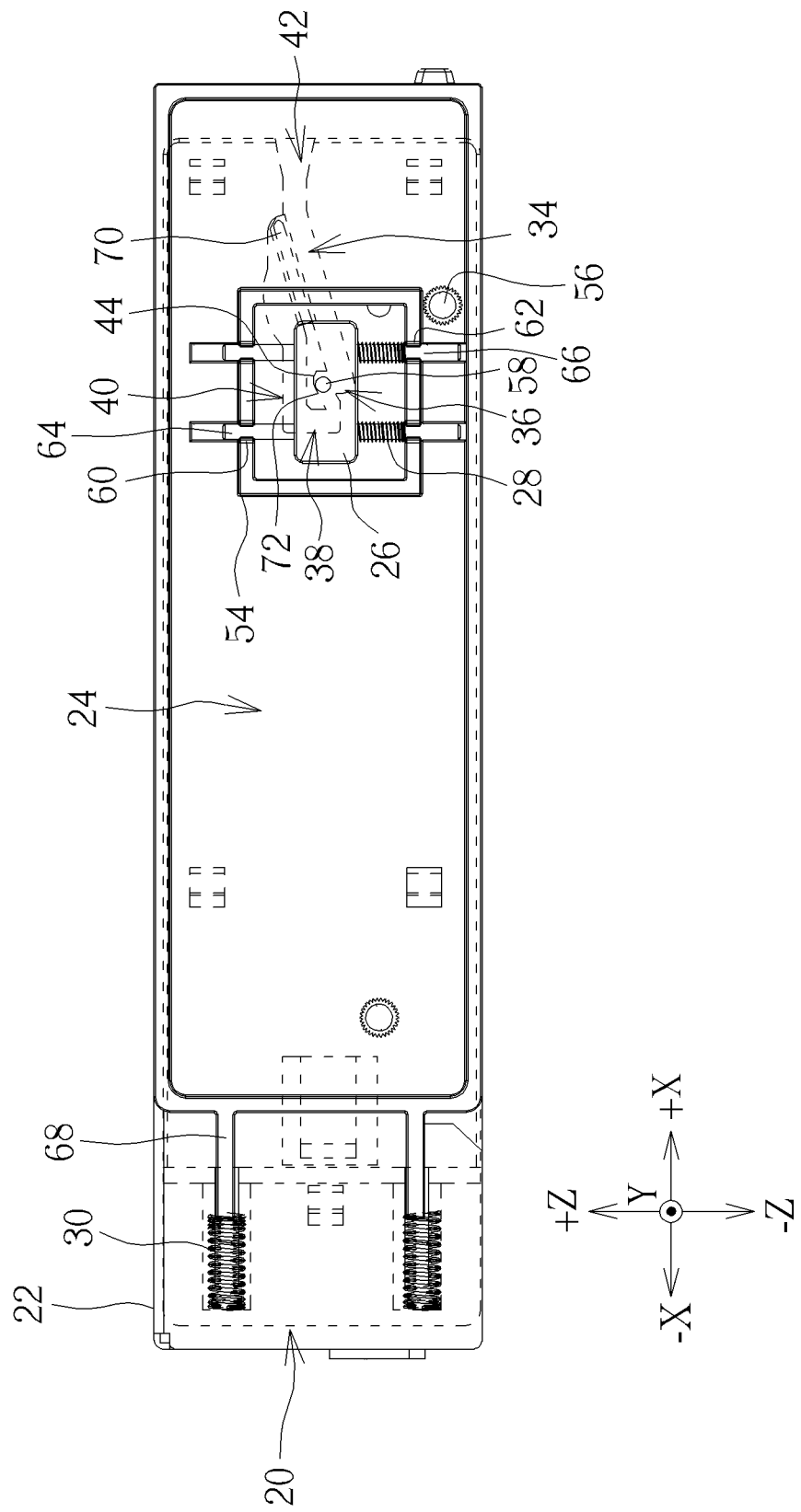
FIG. 15 is a side view of a slope structure extending from the recess in FIG. 8 toward the longitudinal rail to block the guide rod.

It should be mentioned that the second elastic member 30 and the positioning rod 68 could be both an omissible part so as to simplify the structural designs of the rail sheet 20 and the sliding sheet 24. That is, in another embodiment, the rail sheet 20 could make the guide rod 58 fixed in the recess 44 more tightly by increasing concavity of the recess 44 for achieving the purpose that the disk drive 22 could be fixed in the extraction opening 16 without the second elastic member 30 and the positioning rod 68. Furthermore, the aforesaid embodiment could further adopt the design that a block structure additionally extends from the recess 44 to make the guide rod 58 fixed in the recess 44 more steadily. For example, a slope structure 72 could extend from the recess 44 toward the longitudinal rail 38 for blocking the guide rod 58. The related structural design could be as shown in FIG. 15, but not limited thereto.

Figure 16:
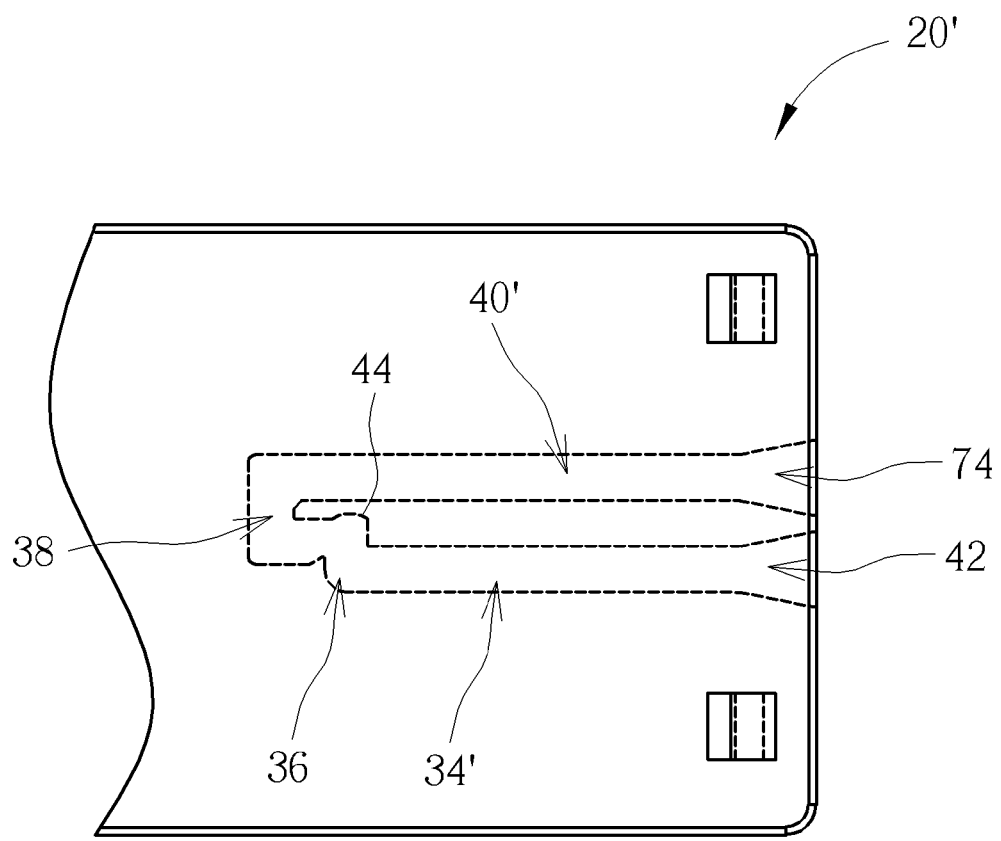
FIG. 16 is a partial side view of a rail sheet according to another embodiment of the present invention.

Furthermore, the rail design of the rail sheet of the present invention could be not limited to the aforesaid embodiment. That is, the rail sheet of the present invention could also adopt the design that the installation rail is parallel to the detaching rail so that the block part could be omitted for simplifying the mechanical design of the server mechanism of the present invention. For example, please refer to FIG. 16, which is a partial side view of a rail sheet 20' according to another embodiment of the present invention. Components both mentioned in FIG. 16 and the aforesaid embodiments represent component with similar functions or structures, and the related description is omitted herein. As shown in FIG. 16, the rail sheet 20' has an installation rail 34', the incurved rail 36, the longitudinal rail 38, and a detaching rail 40'. In this embodiment, the detaching rail 40' could have a second opening 74, and the installation rail 34' and the detaching rail 40' could be both a transverse rail for forming a U-shaped rail cooperatively with the incurved rail 36 and the longitudinal rail 38. Accordingly, the guide rod 58 could enter the installation rail 34' via the first opening 42 when the disk drive 22 is inserted into the extraction opening 16, and could be separated from the detaching rail 40' via the second opening 74. In such a manner, the present invention could still prevent the guide rod 58 from moving to the detaching rail 40' even without the block part when moving along the installation rail 34'.

In summary, the present invention adopts the design that the sliding block could slide upward and downward relative to the sliding sheet and the guide rod on the sliding block could move along the rails on the rail sheet with movement of the disk drive, to achieve the purpose that the disk drive could be fixed in or extracted from the extraction opening. In such a manner, via the aforesaid simple pushing and pulling operations, the present invention could allow the user to quickly assemble the disk drive on the server or disassemble the disk drive from the server without opening an outer cover of the server in advance, so as to greatly improve convenience of the server mechanism in performing the disk drive assembly and disassembly operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A server mechanism comprising:
    a server having an extraction opening; and
    a disk drive module comprising:
        a fixing frame fixed to a position of the server corresponding to the extraction opening;
        a rail sheet disposed at an inner side wall of the fixing frame and having an installation rail, an incurved rail, a longitudinal rail, and a detaching rail communicated with each other, the incurved rail having a recess, the installation rail having a first opening;
        a disk drive movably disposed through the fixing frame;

a sliding sheet disposed at a side of the disk drive corresponding to the rail sheet and having a sliding slot;

a sliding block slidably disposed in the sliding slot and having a guide rod protruding toward the rail sheet, the guide rod being for passing through the first opening and moving along the installation rail, the incurved rail, or the detaching rail when the disk drive moves relative to the extraction opening; and at least one first elastic member disposed between the sliding block and the sliding slot for providing elastic force to drive the guide rod to be fixed in the recess along the incurved rail and to drive the guide rod to move from the longitudinal rail to the detaching rail.

2. The server mechanism of claim 1, wherein the installation rail is an oblique rail, the rail sheet further has a block part, the block part is disposed at a position where the installation rail is communicated with the detaching rail for stopping the guide rod from moving to the detaching rail when the guide rod moves along the installation rail.

3. The server mechanism of claim 2, wherein the disk drive module further comprises at least one second elastic member disposed on the rail sheet, the sliding sheet has a positioning rod protruding toward the at least one second elastic member for pressing the at least one second elastic member, and the at least one second elastic member is used for providing elastic force to the positioning rod when being pressed by the positioning rod so that the guide rod could be driven to be fixed in the recess or move along the detaching rail to make the disk drive eject from the extraction opening.

4. The server mechanism of claim 2, wherein the inner side wall of the fixing frame has a positioning hole and at least one hook hole, the rail sheet has an elastic sheet corresponding to the positioning hole and a hook corresponding to the at least one hook hole, and the elastic sheet is engaged with the positioning hole when the hook is engaged with the at least one hook hole so as to fix the rail sheet on the inner side wall of the fixing frame.

5. The server mechanism of claim 2, wherein the incurved rail has a slope structure extending from the recess toward the longitudinal rail for blocking the guide rod.

6. The server mechanism of claim 2, wherein the sliding sheet further has at least one fixing rod, the at least one fixing rod is inserted into the side of the disk drive corresponding to the rail sheet for fixing the sliding sheet on the disk drive.

7. The server mechanism of claim 2, wherein at least one upper slot hole extends outward from the sliding slot, the sliding block has an upper sliding rod protruding toward the at least one upper slot hole, and the upper sliding rod is movably disposed through the at least one upper slot hole.

8. The server mechanism of claim 7, wherein at least one lower slot hole extends outward from the sliding slot, the sliding block has a lower sliding rod protruding toward the at least one lower slot hole, and the lower sliding rod is movably disposed through the at least one lower slot hole.

9. The server mechanism of claim 1, wherein the detaching rail has a second opening, and when the disk drive is extracted from the extraction opening, the guide rod moves along the detaching rail and then is separated from the detaching rail via the second opening.

10. The server mechanism of claim 9, wherein the installation rail and the detaching rail are both a transverse rail for forming a U-shaped rail cooperatively with the incurved rail and the longitudinal rail.

11. A disk drive module detachably disposed in an extraction opening of a server, the disk drive module comprising:

a fixing frame fixed to a position of the server corresponding to the extraction opening;

a rail sheet disposed at an inner side wall of the fixing frame and having an installation rail, an incurved rail, a longitudinal rail, and a detaching rail communicated with each other, the incurved rail having a recess, the installation rail having a first opening;

a disk drive movably disposed through the fixing frame;

a sliding sheet disposed at a side of the disk drive corresponding to the rail sheet and having a sliding slot;

a sliding block slidably disposed in the sliding slot and having a guide rod protruding toward the rail sheet, the guide rod being for passing through the first opening and moving along the installation rail, the incurved rail, or the detaching rail when the disk drive moves relative to the extraction opening; and at least one first elastic member disposed between the sliding block and the sliding slot for providing elastic force to drive the guide rod to be fixed in the recess along the incurved rail and to drive the guide rod to move from the longitudinal rail to the detaching rail.

12. The disk drive module of claim 11, wherein the installation rail is an oblique rail, the rail sheet further has a block part, the block part is disposed at a position where the installation rail is communicated with the detaching rail for stopping the guide rod from moving to the detaching rail when the guide rod moves along the installation rail.

13. The disk drive module of claim 12, wherein the disk drive module further comprises at least one second elastic member disposed on the rail sheet, the sliding sheet has a positioning rod protruding toward the at least one second elastic member for pressing the at least one second elastic member, and the at least one second elastic member is used for providing elastic force to the positioning rod when being pressed by the positioning rod so that the guide rod could be driven to be fixed in the recess or move along the detaching rail to make the disk drive eject from the extraction opening.

14. The disk drive module of claim 13, wherein the incurved rail has a slope structure extending from the recess toward the longitudinal rail for blocking the guide rod.

15. The disk drive module of claim 14, wherein the sliding sheet further has at least one fixing rod, the at least one fixing rod is inserted into the side of the disk drive corresponding to the rail sheet for fixing the sliding sheet on the disk drive.

16. The disk drive module of claim 15, wherein at least one upper slot hole extends outward from the sliding slot, the sliding block has an upper sliding rod protruding toward the at least one upper slot hole, the upper sliding rod is movably disposed through the at least one upper slot hole, at least one lower slot hole extends outward from the sliding slot, the sliding block has a lower sliding rod protruding toward the at least one lower slot hole, and the lower sliding rod is movably disposed through the at least one lower slot hole.

* * * * *